(12) United States Patent
Kano et al.

(10) Patent No.: US 6,242,719 B1
(45) Date of Patent: Jun. 5, 2001

(54) MULTIPLE-LAYERED CERAMIC HEATER

(75) Inventors: Shoji Kano; Ryouji Iwai; Kenji Ito, all of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/328,158

(22) Filed: Jun. 8, 1999

(30) Foreign Application Priority Data

Jun. 11, 1998 (JP) .................................................. 10-179712

(51) Int. Cl.[7] ............................... H05B 3/68; H05B 3/08
(52) U.S. Cl. .......................................... 219/444.1; 219/541
(58) Field of Search .............................. 219/444.1, 465.1, 219/466.1, 541, 542, 543, 544, 546; 338/307, 308, 309, 312, 322, 324, 330

(56) References Cited

U.S. PATENT DOCUMENTS

| | | | |
|---|---|---|---|
| 4,598,024 | * 7/1986 | Stinton et al. | 428/448 |
| 4,943,543 | * 7/1990 | Ingelstrom | 501/97.1 |
| 5,233,166 | * 8/1993 | Maeda et al. | 219/552 |
| 5,280,156 | * 1/1994 | Niori et al. | 219/385 |
| 5,350,720 | * 9/1994 | Kawada et al. | 501/97.1 |
| 5,683,606 | * 11/1997 | Ushikoshi et al. | 219/544 |
| 5,904,872 | * 5/1999 | Arami et al. | 219/444.1 |

\* cited by examiner

*Primary Examiner*—Sang Paik
(74) *Attorney, Agent, or Firm*—Hogan & Hartson L.L.P.

(57) ABSTRACT

There is disclosed an integrated type multiple-layered ceramic heater based on resistance heating comprising an electrical insulating ceramic support substrate, a heater pattern composed of electroconductive ceramic or metal, which is adhered to a surface of the substrate, and an electrical insulating ceramic protective layer covering the heater pattern, wherein a feeding terminal of the heater is connected to a power source terminal member through a feeding member which generates heat when supplied with electric current. The feeding member preferably generates heat at a power density substantially equal to that of the heater. The multiple-layered ceramic heater of the present invention exhibits excellent thermal uniformity, and does not adversely affect thermal uniformity of an object to be heated even when the feeding terminal is present at a location facing the object to be heated.

9 Claims, 5 Drawing Sheets

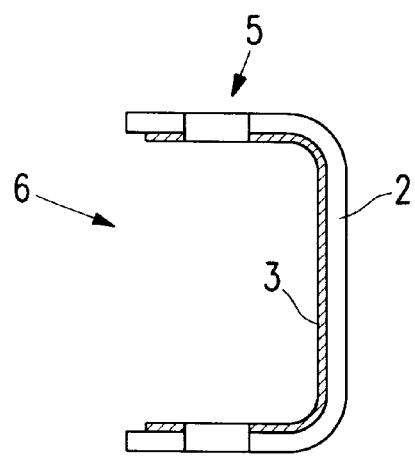
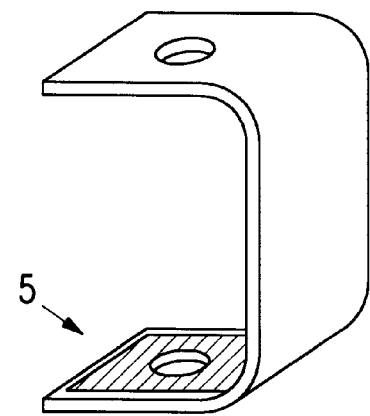
FIG. 5(a)    FIG. 5(b)
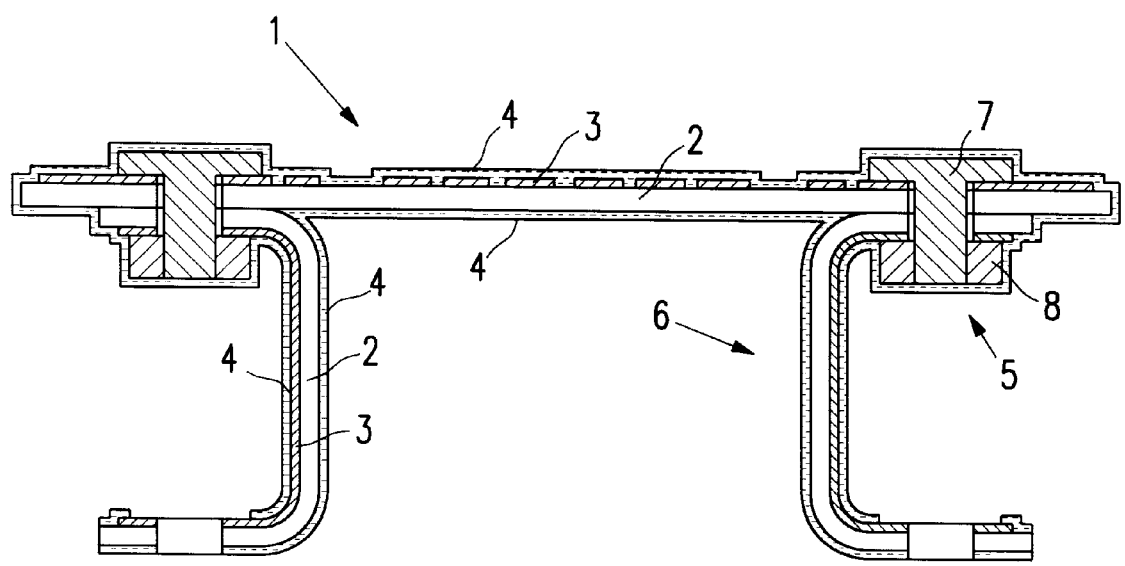
FIG. 6

MULTIPLE-LAYERED CERAMIC HEATER

BACKGROUND OF THE INVENTION

1. Field of the Invention

The present invention relates to a ceramic heater, in particular, a multiple-layered ceramic heater that is used in a temperature increasing and decreasing step of semiconductor fabrication process.

2. Description of Related Art

As a heater used in a semiconductor fabrication process, there has conventionally been used one comprising a support substrate composed of a sintered ceramic such as alumina, aluminum nitride, zirconia or boron nitride, which is wound or adhered with a wire or foil of high melting point metal such as molybdenum or tungsten as a heat generating body, and an insulating ceramic plate placed thereon. Further, as an improved version of such a heater with improved insulating property and anticorrosion property, there has been developed a ceramic heater comprising an electrical insulating support substrate, a heater pattern composed of electroconductive ceramic, which is adhered to a surface of the substrate as a heat generating layer, and an electrical insulating ceramic protective layer covering the heater pattern.

On the other hand, wafers of increasingly large diameter are being used in the production of semiconductor devices, and the diameter of mainstream silicon wafers is currently 200 mm, and is expected to reach 300 mm by the year 2010. When the diameter becomes larger, it becomes difficult to ensure production performance, such as process uniformity, by a conventional apparatus for batch processing, and it is expected that processes replaced by a single wafer processing process where wafers are treated one by one will increase to solve the foregoing problem.

As a heat source of the aforementioned single wafer processing treatment, ceramic heaters are seen as having great potential because they consume little electric power and exhibit excellent stability, and adaptation to a larger diameter and improvement of performance thereof have been attempted in parallel. Further, because wafer temperature greatly affects the properties of thin films formed on the wafers and film forming rate, with use of a larger diameter of wafers, how to control thermal uniformity over a larger surface of the wafers becomes an important issue.

On the other hand, as for the ceramic heater, which is a heat source, a multiple-layered ceramic heater 1 (occasionally referred to as simply "heater" hereinafter) comprises, as shown in FIG. 7 for example, a support substrate 2, heat generating layer 3, and protective layer 4, and feeding terminals 5 are connected to power terminal members 10 usually each comprising a bolt 7 and feeding support shaft 9. When the heater is supplied with electric current to generate heat, the power terminal members 10 act as a heat radiator to radiate the heat. Therefore, the temperature around the feeding terminals 5 of the heater decreases, and the temperature of portions of a wafer W facing the feeding terminals 5 also decreases. Accordingly, the thermal uniformity of the wafer as a whole is degraded. If the wafer in this state is heat-treated or subjected to film forming thereon, characteristics or properties of the film on the portions of reduced temperature would be different from those of the other portions. This degrades quality parameters, reduces productivity in the device production, and constitutes one of the causes of reduced yield.

While it is considerable to solve the aforementioned problem by disposing the feeding terminals at positions not facing the wafer to be heated, the wafer would still be affected by the portions of reduced temperature unless the feeding terminals were separated from the periphery of the wafer by a substantial distance. This would lead to a substantially larger size of the heater compared with the object to be heated, and therefore the apparatus as a whole would have to be made larger. This would be a cause of increased equipment cost and heater production cost.

SUMMARY OF THE INVENTION

The present invention has been accomplished in order to overcome the aforementioned problems, and its major object is to provide a multiple-layered ceramic heater excellent in thermal uniformity, whose ability to uniformly heat an object to be heated is not adversely affected by feeding terminals of the heater even when the terminals are present at positions facing the object to be heated.

In order to achieve the foregoing object, the present invention provides an integrated type multiple-layered ceramic heater based on resistance heating comprising an electrical insulating ceramic support substrate, a heater pattern composed of electroconductive ceramic or metal, which is adhered to a surface of the substrate, and an electrical insulating ceramic protective layer covering the heater pattern, characterized in that feeding terminals of the heater are connected to power source terminal members through feeding members which generate heat when supplied with electric current.

According to the aforementioned structure, heat generated in the vicinity of each feeding terminal of the multiple-layered ceramic heater is not substantially conducted to the power terminal member through the feeding member and is not radiated therefrom. Therefore, an object to be heated placed over the upper surface of the heater, for example, the whole surface of a semiconductor wafer, is substantially uniformly heated, and its thermal uniformity is maintained. Accordingly, heat treatment of the wafer or film forming thereon can substantially uniformly performed over the entire surface of the wafer, and thus productivity and yield in the device production process can be improved.

In the aforementioned ceramic heater, the feeding member preferably generates heat at a power density substantially equal to that of the heater.

By that, the calorific power of the feeding member and the calorific power of the heater become substantially the same, and thus heat conduction from the feeding terminal portion of the heater to the power terminal member through the feeding member is substantially completely eliminated. Therefore, the temperature around the feeding terminal is not decreased, and it becomes possible to substantially uniformly heat the whole surface of an object to be heated.

In the aforementioned ceramic heater, the support substrate and the protective layer of the heater, and the support substrate and the protective layer of the feeding member are preferably composed of AlN, BN, a complex of AlN and BN, PBN or $SiO_2$, and the heater pattern of the heater and the feeding members is preferably composed of carbon, high melting point metal, high melting point metal alloy, noble metal or noble metal alloy.

When the heater and the feeding members are constituted of materials selected from the particular materials mentioned above, characteristics required for the support substrate, the protective layer and the heater pattern can be sufficiently satisfied, and production and processing of the members become easy. At the same time, a long-life multiple-layered ceramic heater excellent in mechanical strength, heat resistance, and anticorrosion property can be obtained.

In the ceramic heater of the present invention, the support substrate, the protective layer, and the heater pattern constituting the heater and the feeding members are preferably formed by chemical vapor deposition.

If the heater and the feeding members are formed by chemical vapor deposition as described above, the heater pattern can be made in an arbitrary shape, and a member having a power density of desired value can easily be produced. As a result, a multiple-layered ceramic heater exhibiting excellent thermal uniformity, i.e., capable of uniformly heating the whole surface of an object to be heated can be produced.

As another aspect of the present invention, the present invention also provides a feeding member for connecting a feeding terminal and a power terminal member of a multiple-layered ceramic heater, characterized in that it comprises an electrical insulating ceramic support substrate, a heater pattern composed of electroconductive ceramic or metal, which is adhered to a surface of the substrate, and an electrical insulating ceramic protective layer covering the heater pattern.

In the aforementioned feeding member having a triple-layer structure comprising the electrical insulating ceramic support substrate, the heater pattern and the electrical insulating ceramic protective layer as described above, when electric power is supplied by connecting the feeding terminal and the power terminal member, heat generated by the feeding member compensates for the heat radiation from the neighborhood of the feeding terminal of the heater. Therefore, heat conduction from the feeding terminal portion of the heater to the power terminal member through the feeding member is substantially completely eliminated, and it becomes possible to substantially uniformly heat the whole surface of an object to be heated. In addition, because the feeding member has high temperature anticorrosion property substantially equal to that of the heater, it causes almost no contamination of the object to be heated, and durability of the feeding member itself is also prolonged and made stable.

According to the present invention, there is provided a multiple-layered ceramic heater that can prevent temperature decreasing phenomenon of local portions of semiconductor wafers facing feeding members mainly caused by the connection scheme of the feeding terminal and a power terminal member when a semiconductor wafer is heated with a multiple-layered ceramic heater. The heater allows uniform heating of the entire surface of wafers, and has high performance and long-term stability. When wafers are heat-treated or films are formed on wafers by using the heater, a film having uniform thickness and quality over the entire wafer surface can be formed, and thus productivity and yield of the device production can be improved.

BRIEF DESCRIPTION OF THE DRAWINGS

FIG. 5 represents the feeding member for the multiple-layered ceramic heater of Example 2. (a) Vertical cross-sectional view, (b) perspective view.

FIG. 6 is a vertical cross-sectional view of a multiple-layered ceramic heater having connected and integrated feeding members according to the present invention.

DESCRIPTION OF THE INVENTION AND EMBODIMENTS

Embodiments of the present invention will be explained in more detail hereinafter by referring to the appended drawings, but the scope of the present invention is not limited thereto.

Figure 1A:
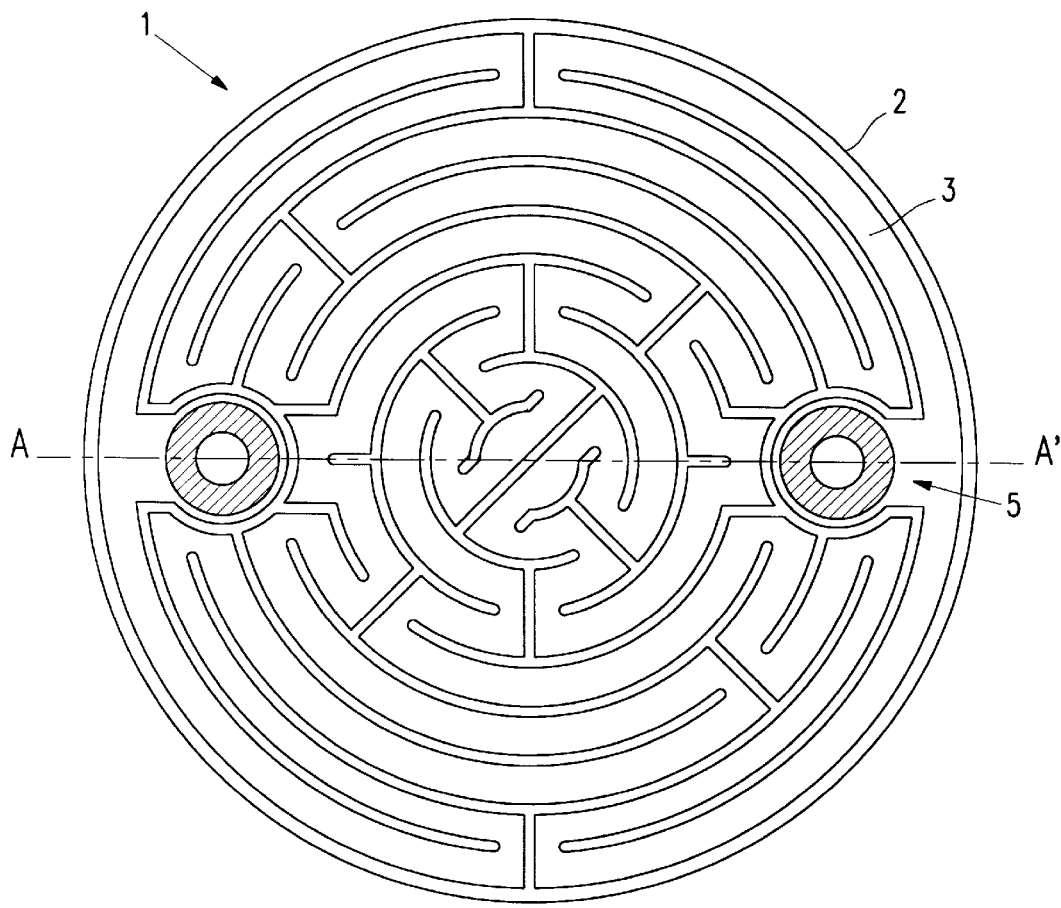
FIG. 1 represents an exemplary multiple-layered ceramic heater of the present invention. (a) Plan view, (b) vertical cross-sectional view along line A-A'.
Figure 1B:
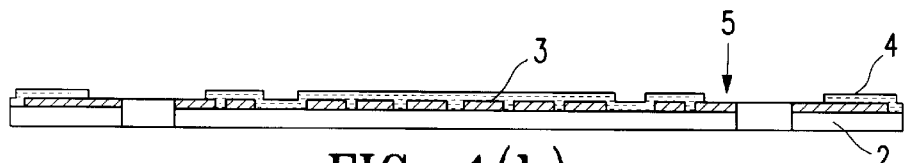
Figure 2A:
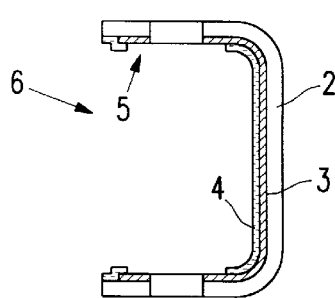
FIG. 2 represents an exemplary feeding member for multiple-layered ceramic heater of the present invention. (a) Vertical cross-sectional view, (b) perspective view.
Figure 2B:
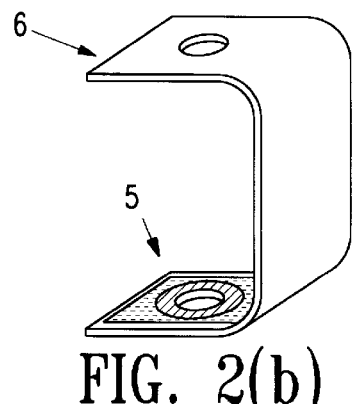
Figure 3:
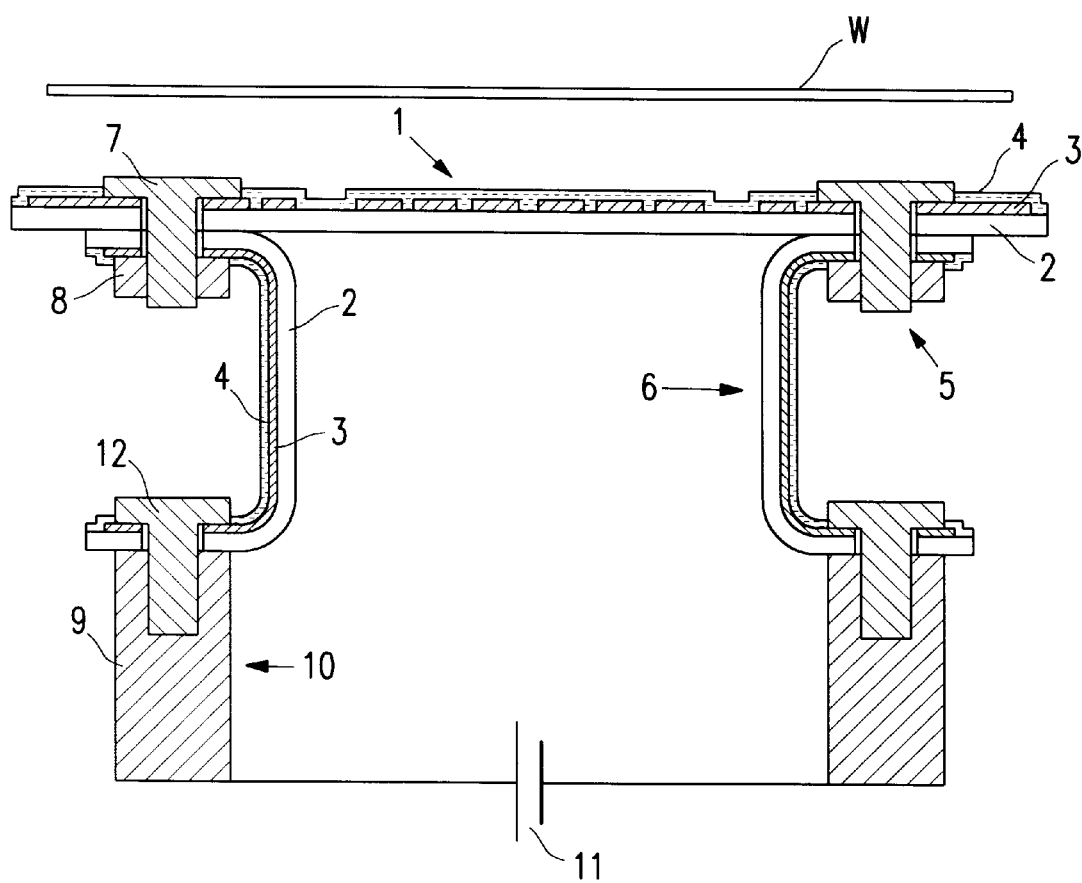
FIG. 3 is a vertical cross-sectional view of a multiple-layered ceramic heater of the present invention which is connected to power terminal members through feeding members, shown in use for heating a wafer.

FIG. 1 represents an example of the multiple-layered ceramic heater of the present invention. FIG. 1(a) is a plan view thereof, and FIG. 1(b) is a vertical cross-sectional view thereof. FIG. 2 represents an example of the feeding member of the present invention. FIG. 2(a) is a vertical cross-sectional view thereof, and FIG. 2(b) is a perspective view thereof. FIG. 3 is a vertical sectional view representing the multiple-layered ceramic heater and the feeding members of the present invention in use.

The inventors of the present invention conducted various studies about the temperature decreasing phenomenon in localized portions of wafers facing heater feeding terminals, which is observed when a semiconductor wafer is heated in a CVD apparatus, etching apparatus or the like in the semiconductor fabrication process. As a result, they found that the problem can be solved by using as a feeding member for connecting a feeding terminal and a power terminal member, one composed of a member which generates heat when supplied with electric current. The inventors of the present invention investigated various conditions for achieving the aforementioned feature of the present invention in detail, and thus completed the present invention.

The multiple-layered ceramic heater 1 shown in FIGS. 1(a) and (b) comprises a support substrate 2 of disc shape, which is composed of electrical insulating pyrolytic boron nitride, a heater pattern 3 adhered to the surface of the support substrate 2 as a heat generating layer, which pattern is composed of electroconductive pyrolytic graphite, and a protective layer 4 composed of the same material as the support substrate 2 and covering the heater pattern 3. This heat generating member is provided with two feeding terminals 5 at its periphery portion, and they are connected to an external power source with bolts, passed through holes of the terminals, and nuts.

FIGS. 2(a) and (b) are a vertical cross-sectional view and a perspective view of an exemplary feeding member 6 of the present invention, and the member comprises, as in the heater 1, a support substrate 2, which is composed of electrical insulating pyrolytic boron nitride, a heater pattern 3 adhered to the surface of the support substrate 2 as a heat generating layer, which pattern is composed of electroconductive pyrolytic graphite, and a protective layer 4 composed of the same material as the support substrate 2 and covering the heater pattern 3. The member is in a shape formed by folding a strip along two lines perpendicular to its longitudinal direction at right angles and having a U-shaped cross-section. This heat generating layer has feeding terminals 5 at both ends, and one terminal is connected to the heater 1 with a bolt 7, passed through the terminal hole, and a nut 8, and the other terminal to a power terminal member.

FIG. 3 is a vertical cross-sectional view representing the heater 1 in use for heating a semiconductor wafer W. The heater 1 is positioned at a small distance from the semiconductor wafer W, and connected to power terminal members 10 and a power source 11 through the feeding members 6.

The feeding terminals 5 of the heater 1 and the terminals of the feeding members 6 can be connected with bolts 7 and nuts 8 made of heat-resistant metal or electroconductive ceramic, and the other terminals of the feeding members 6 are connected to the power source 11 through power terminal members 10 each composed of a feeding support shaft 9 with bolts 12.

In the aforementioned structure, as a feature of the present invention, since the feeding member 6 which generates heat upon supply of electric current is connected to the feeding terminal 5 of the heater 1, the temperature decrease around the feeding terminal 5 is suppressed, and therefore localized temperature decrease of an object to be heated, for example, the semiconductor wafer W, facing the feeding terminal 5 can be prevented. As a result, the whole surface of the wafer can be uniformly heat-treated, and a film having a uniform thickness and uniform quality can be formed over the entire surface of the wafer. Thus, productivity and yield in device production can be improved.

Further, if the heat generation amount of the feeding member 6, which is represented as heat generation amount per unit area of the heat generating layer, i.e., calorific power density (W/cm$^2$), is substantially equal to the calorific power density of the heater 1, the heat amount generated by the feeding member 6 is added to the heat generated in the neighborhood of the feeding terminal 5, and therefore the heat conduction from the neighborhood of the feeding terminal 5 of the heater 1 to the power terminal member 10 through the feeding member 6 is substantially completely eliminated. Accordingly, it becomes possible to substantially uniformly heat the whole surface of an object to be heated.

Another embodiment of the present invention where the heater 1 and the feeding members 6 are integrated is shown in FIG. 6.

Each member has a structure comprising a support substrate 2 composed of electrical insulating pyrolytic boron nitride in a shape formed by folding a strip and having a U-shaped cross-section, and a heater pattern 3 adhered to the surface of the support substrate 2 as a heat generating layer, which pattern is composed of electroconductive pyrolytic graphite. This heat generating layer has feeding terminals 5 at its both ends. One terminal is connected to the heater 1 with a bolt 7, passed through the terminal hole, and a nut 8, and the other terminal is connected to the power terminal member.

On the other hand, the heater 1 used in this example has the same layered structure as in the aforementioned feeding member 6, and comprises a support substrate 2 of disc shape, which is composed of electrical insulating pyrolytic boron nitride, and a heater pattern 3 adhered to the surface of the support substrate 2 as a heat generating layer, which is composed of electroconductive pyrolytic graphite. This heat generating member is provided with two feeding terminals 5 at its periphery, and they are connected to the feeding members 6 with bolts 7, passed through holes of the terminals, and nuts 8.

FIG. 6 is a vertical cross-sectional view of the completed heater of this embodiment. The aforementioned heater 1 in the double-layered structure is connected with the double-layered feeding members 6 with bolts 7 and nuts 8 made of carbon, and the entire surface of this structure is coated with electrical insulating pyrolytic boron nitride as a protective layer 4.

Because the bolts and the nuts are completely covered with the protective layer in such a structure as mentioned above, they cause almost no contamination of the object to be heated, a semiconductor wafer. In addition, corrosion of the carbon heater layer, bolts and nuts is less even in an oxidizing atmosphere, and the operation can be performed stably over a long period of time.

As for the materials of the multiple-layered ceramic heater and the feeding member of the present invention, the support substrate and the protective layer are suitably composed of AlN, BN, a complex of AlN and BN, PBN or $SiO_2$, which are highly electrical insulating ceramics. The heater pattern to be the heat generating layer is preferably composed of carbon (graphite), high melting point metal (iron, copper, nickel, molybdenum, tantalum, tungsten etc.), high melting point metal alloy (Ni—Cr, Fe—Cr, Fe—Cr—Al etc.), noble metal (silver, platinum, rhodium etc.) or noble metal alloy (Pt—Rh etc.), which are highly heat-resistant and have appropriate electrical resistance.

The support substrate, the heater layer and the protective layer constituting the multiple-layered ceramic heater and the feeding member of the present invention, except for a few metal heat generating layers, are preferably produced by chemical vapor deposition (CVD). The CVD technique provides uniform film thickness and deposited layers of high density and high purity, and affords a heater allowing little leakage current, and offering high temperature increase capability, good temperature controllability of each member, ease of uniform heating, and stable operation over a long period of time.

EXAMPLES

The present invention will be specifically explained hereinafter with reference to the following examples, but the present invention is not limited thereto.

Example 1

By a CVD technique, ammonia and boron trichloride were reacted at 1800° C. at a pressure of 100 Torr to form a support substrate composed of pyrolytic boron nitride having a thickness of 2 mm, then methane gas was pyrolyzed at 1650° C. under 50 Torr to form a pyrolytic graphite layer having a thickness of 100 μm on the substrate, and a heater pattern was processed. Then, the heat generating layer was covered with a protective layer of pyrolytic boron nitride having a thickness of 100 μm by again subjecting the substrate to a reaction of ammonia and boron trichloride at 1800° C. at a pressure of 100 Torr to produce a multiple-layered ceramic heater as shown in FIG. 1.

Figure 4:
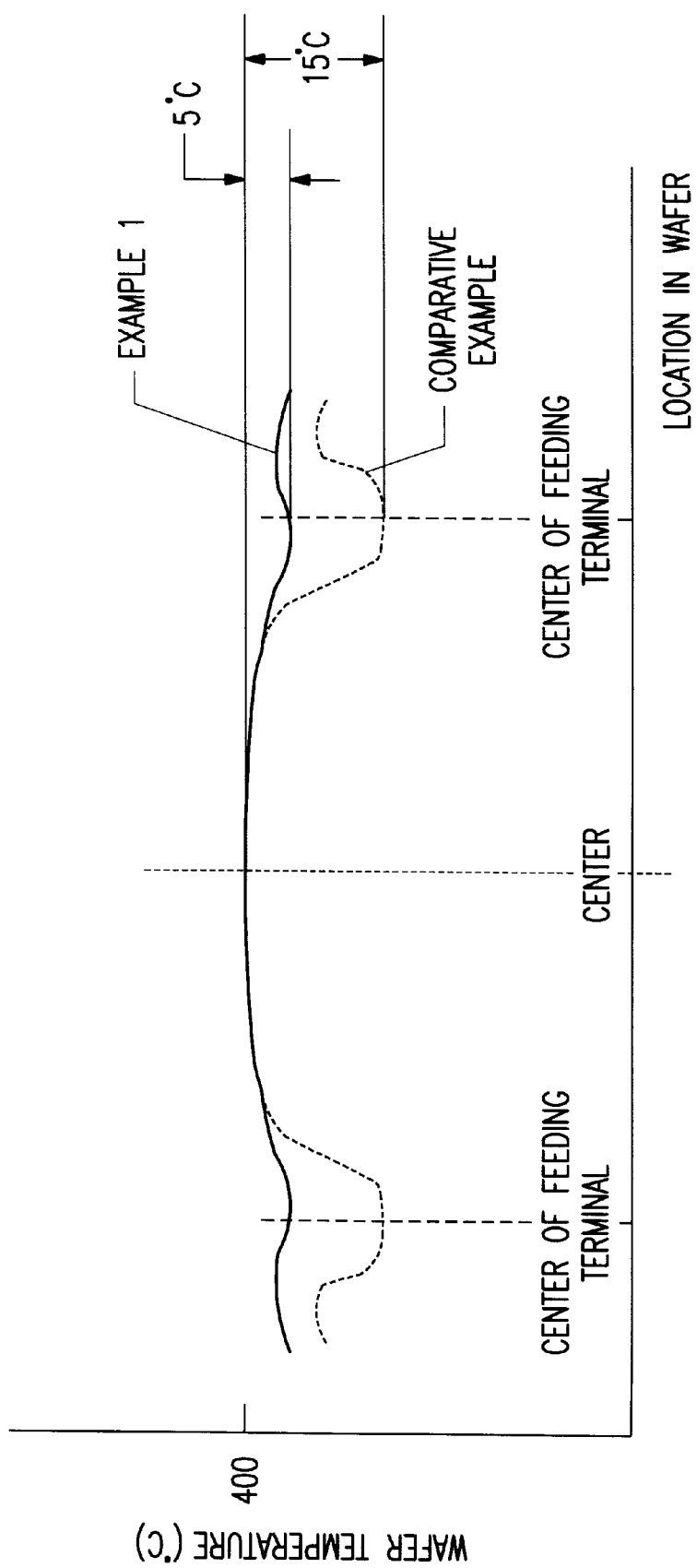
FIG. 4 is a graph representing temperature distribution in wafers along the radial direction when the wafers were heated by a multiple-layered ceramic heater provided with a feeding member according to the present invention or a conventional multiple-layered ceramic heater.

By the same production method as that for the aforementioned multiple-layered ceramic heater, feeding members having a heat generating mechanism and structure similar to those shown in FIG. 2 were produced. The heater and one end of each feeding member were connected with a heat-resistant metal bolt and nut to produce a multiple-layered ceramic heater having connected feeding members. Then, the other end of each feeding member was connected to a power source through a power terminal member. A semiconductor wafer was positioned over the heater at a distance of 10 mm as shown in FIG. 3, and heated to a predetermined temperature (about 400° C.). Then, the in-plane temperature distribution of the semiconductor wafer along the radial direction was determined. As a result, as shown in FIG. 4, it was found that the thermal uniformity was markedly improved, i.e., the temperatures of the portions of the wafer facing the feeding terminal of the heater were lower than the temperature of the wafer center by only 5° C.

Comparative Example

Figure 7:
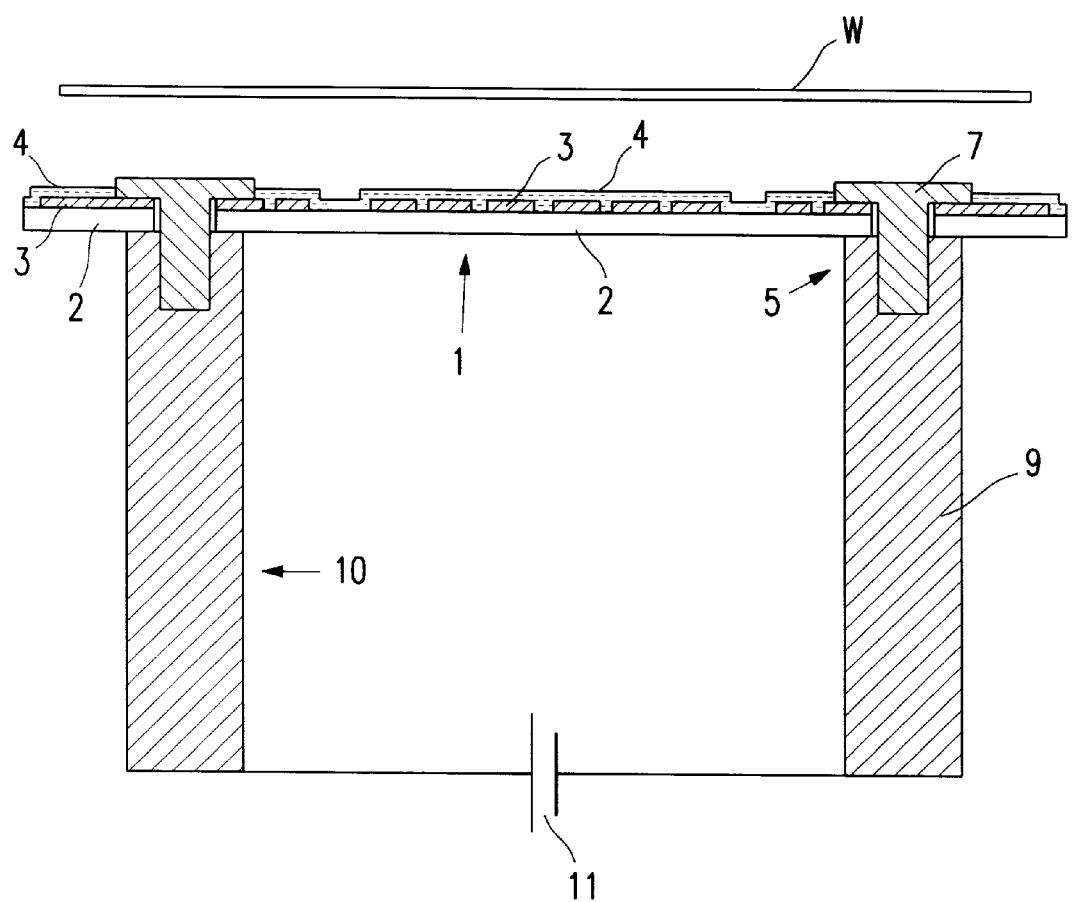
FIG. 7 is a vertical cross-sectional view representing the connection scheme of a conventional multiple-layered ceramic heater with power terminal members when the heater is used for heating a wafer.

The feeding terminals of the multiple-layered ceramic heater produced in Example 1 were fixed to one ends of the feeding support shafts of power terminal members of conventional connecting structure with bolts, and electric current was supplied by connecting the other ends of the shafts to a power source as shown in FIG. 7. Then, the in-plane temperature distribution of the semiconductor wafer along the radial direction was determined. The results are also shown in FIG. 4. As seen from the results shown in FIG. 4, it was found that the temperatures of the portions of the wafer facing the feeding terminals of the heater were lower than the temperature of the wafer center by 15° C. in the conventional connecting structure.

Example 2

By a CVD technique, ammonia and boron trichloride were reacted at 1800° C. at a pressure of 100 Torr to form a support substrate composed of pyrolytic boron nitride having a thickness of 2 mm, then methane gas was pyrolyzed at 1650° C. under 50 Torr to form a pyrolytic graphite layer having a thickness of 100 $\mu$m on the substrate, and a heater pattern was processed.

Then, feeding members shown in FIG. 5 having a heat generating mechanism similar to that of the heater were produced in the same manner as in the production of the aforementioned multiple-layered ceramic heater. The heater and these feeding members were connected with bolts and nuts made of carbon. Then, the heat generating layer was covered with a protective layer of pyrolytic boron nitride having a thickness of 100 $\mu$m again through a reaction of ammonia and boron trichloride at 1800° C. at a pressure of 100 Torr to produce a multiple-layered ceramic heater whose heater and feeding members were integrated as shown in FIG. 6. When the in-plane temperature distribution along the radial direction of a semiconductor wafer heated using the above heater was determined in a manner similar to that of Example 1, it was found that the thermal uniformity was improved to a degree similar to that observed in Example 1.

The present invention is not limited to the embodiments described above. The above-described embodiments are mere examples, and ones having the substantially same structure as that described in the appended claims and providing the similar functions and advantages are included in the scope of the present invention.

While two examples were set out in the above description, the present invention is not limited to these. For example, the shape of the feeding members to be connected to the heater, location of the connection, heater pattern and the like may be suitably changed according to the temperature-decreasing position of the object to be heated, degree of temperature difference and the like, and, therefore, the shape and position of the feeding member, heater pattern and the like are not limited to those mentioned above.

The ceramic heater of the present invention can be preferably used as a heater for a semiconductor wafer in a CVD apparatus. However, the present invention is not limited to such use, and the heater can be effectively used as a heater of semiconductor fabrication apparatuses such as those for vacuum deposition, ion plating, dry etching and the like.

What is claimed is:

1. An integrated type multiple-layered ceramic heater based on resistance heating comprising an electrical insulating ceramic support substrate, a heater pattern composed of electroconductive ceramic or metal, which is adhered to a surface of the substrate, and an electrical insulating ceramic protective layer covering the heater pattern, wherein a feeding terminal of the heater is connected to a power source terminal member through a feeding member having the heater pattern which generates heat when supplied with electric current.

2. The multiple-layered ceramic heater according to claim 1, wherein the feeding member generates heat at a power density substantially equal to that of the heater.

3. The multiple-layered ceramic heater according to claim 1, wherein the support substrate and the protective layer of the heater, and the a protective layer of the feeding member are composed of AlN, BN, a complex of AlN and BN, PBN or SiO$_2$, and the heater pattern of the heater and the feeding member is composed of carbon, high melting point metal, high melting point metal alloy, noble metal or noble metal alloy.

4. The multiple-layered ceramic heater according to claim 2, wherein the support substrate and the protective layer of the heater, and the support substrate and the protective layer of the feeding member are composed of AlN, BN, a complex of AlN and BN, PBN or SiO$_2$, and the heater pattern of the heater and the feeding member is composed of carbon, high melting point metal, high melting point metal alloy, noble metal or noble metal alloy.

5. The multiple-layered ceramic heater according to claim 1, wherein the support substrate, the feeding member, and the protective layer constituting the multiple-layered ceramic heater and the feeding member are formed by chemical vapor deposition.

6. The multiple-layered ceramic heater according to claim 2, wherein the support substrate, the feeding member, and the protective layer constituting the multiple-layered ceramic heater and the feeding member are formed by chemical vapor deposition.

7. The multiple-layered ceramic heater according to claim 3, wherein the support substrate, the feeding member, and the protective layer constituting the multiple-layered ceramic heater and the feeding member are formed by chemical vapor deposition.

8. The multiple-layered ceramic heater according to claim 4, wherein the support substrate, the feeding member, and the protective layer constituting the multiple-layered ceramic heater and the feeding member are formed by chemical vapor deposition.

9. A feeding member for connecting a feeding terminal and a power terminal member of a multiple-layered ceramic heater, wherein the feeding member comprises an electrical insulating ceramic support substrate, a heater pattern composed of electroconductive ceramic or metal, which is adhered to a surface of the substrate, and an electrical insulating ceramic protective layer covering the heater pattern.

* * * * *